US008810548B2

(12) United States Patent
Ko

(10) Patent No.: US 8,810,548 B2
(45) Date of Patent: Aug. 19, 2014

(54) MOBILE TERMINAL

(75) Inventor: Dong Seuck Ko, Suwon-si (KR)

(73) Assignee: LG Electronics Inc., Seoul (KR)

( * ) Notice: Subject to any disclaimer, the term of this patent is extended or adjusted under 35 U.S.C. 154(b) by 987 days.

(21) Appl. No.: 12/899,428

(22) Filed: Oct. 6, 2010

(65) Prior Publication Data
US 2011/0096033 A1   Apr. 28, 2011

(30) Foreign Application Priority Data

Oct. 26, 2009  (KR) ........................ 10-2009-0101852

(51) Int. Cl.
*G06F 3/042*  (2006.01)
(52) U.S. Cl.
USPC ......................................... 345/175
(58) Field of Classification Search
USPC ................................. 345/175–178
See application file for complete search history.

(56) References Cited

U.S. PATENT DOCUMENTS

| 5,900,863 A | 5/1999 | Numazaki | |
|---|---|---|---|
| 2006/0161871 A1* | 7/2006 | Hotelling et al. | 715/863 |
| 2007/0125937 A1 | 6/2007 | Eliasson et al. | |
| 2007/0130547 A1 | 6/2007 | Boillot | |
| 2007/0152977 A1 | 7/2007 | Ng et al. | |
| 2008/0100572 A1* | 5/2008 | Boillot | 345/158 |
| 2008/0252595 A1* | 10/2008 | Boillot | 345/156 |

FOREIGN PATENT DOCUMENTS

WO     2008/111079     9/2008

* cited by examiner

*Primary Examiner* — Yong H Sim
(74) *Attorney, Agent, or Firm* — Lee, Hong, Degerman, Kang & Waimey

(57) ABSTRACT

A mobile terminal comprising a case; a display within the case for displaying visual information; a sensing unit for detecting an object in proximity of the display, wherein the sensing unit comprises a proximity sensor having a plurality of light emitting devices and a light receiving device, wherein the sensing unit detects the object's location when light emitted by at least one of the light emitting devices is reflected by the object and enters the light receiving device, and wherein the sensing unit detects the object's movement pattern when lights emitted by at least one of the light emitting devices are sequentially reflected by the object and enter the light receiving device; and a controller for generating a signal corresponding to an input based on the object's detected location and movement pattern.

14 Claims, 13 Drawing Sheets

MOBILE TERMINAL

CROSS REFERENCE TO RELATED APPLICATIONS

Pursuant to 35 U.S.C. §119(a), this application claims the benefit earlier filing date and right of priority to Korean Patent Application No. 10-2009-0101852, filed on Oct. 26, 2009, the contents of which are hereby incorporated by reference herein in its entirety.

RELATED FIELD

The disclosed subject matter is directed to an input device for a mobile communication terminal. Although one embodiment is suitable for a wide scope of applications, it is particularly suitable for providing various display effects and various haptic effects in a manner of generating an input signal corresponding to a direction key or direction shift by detecting a proximity position of an object and a motion pattern of the object.

BACKGROUND

A mobile terminal is a device which may be configured to perform various functions. Examples of such functions include data and voice communications, capturing images and video via a camera, recording audio, playing music files and outputting music via a speaker system, and displaying images and video on a display. Some terminals include additional functionality which supports game playing, while other terminals are also configured as multimedia players. Recently, mobile terminals have been configured to receive broadcast and multicast signals which permit viewing of content such as videos and television programs.

Generally, terminals may be classified into mobile terminals and stationary terminals according to the presence or absence of mobility. And, the mobile terminals may be further classified into handheld terminals and vehicle mount terminals. There are ongoing efforts to support and increase the functionality of mobile terminals. Such efforts include software and hardware improvements, as well as changes and improvements in the structural components which form the mobile terminal.

For example, a mobile terminal such as a mobile phone is provided with a button type keypad as an input device. The button type keypad includes 10 or more numeral key buttons and additionally includes a direction key, a function key for executing a specific function and the like. In some mobile terminals, a touch type keypad is adopted instead of a button type keypad. A plurality of touch sensors are provided to specific positions of the touch type keypad to detect which one of the specific positions is touched, thereby performing the function of the conventional button type keypad.

The touch type keypad includes an area on the face of the terminal for installation of a touch panel. This makes it difficult to configure a mobile terminal which is compact in size. It would be desirable to substitute the touch pad with another input device that does not require as much of a real-estate footprint on the face of the mobile terminal. The savings in real-estate footprint would allow the mobile terminal to be implemented in a way so that it is more compact or can carry a larger size display.

SUMMARY

A mobile terminal according to one embodiment includes a case, a display within the case for displaying visual information, a sensing unit within the case for detecting an object in proximity to the display, and a controller within the case for generating a signal corresponding to an input based on the object's location and movement pattern. The sensing unit, which comprises a proximity sensor having a plurality of light emitting devices and a light receiving device, detects the object's location when light emitted by one of the light emitting devices is reflected by the object and enters the light receiving device and also detects the object's movement pattern when lights emitted by adjacent light emitting devices are sequentially reflected by the object and enter the light receiving device.

In one embodiment, the input comprises at least one of a numeral key, a character key, a direction key, a direction shift, a scroll key, and a function key. In one embodiment, the adjacent light emitting devices emit light sequentially clockwise or counterclockwise. In one embodiment, the light emitting devices are arranged in a circle around the light receiving device. In one embodiment, number of the light emitting devices ranges from 2 through 8. In one embodiment, the proximity sensor further comprises a compensation light emitting device configured to emit light toward the light receiving device.

In one embodiment, the sensing unit comprises a plurality of proximity sensors, wherein the proximity sensors are arranged horizontally or vertically on the display, and horizontal or vertical movement of the object is detected two proximity sensors that are adjacent to each other. In one embodiment, the proximity sensor is located at a lower side or a peripheral area of the display. In one embodiment, the sensing unit detects the object's proximity to the display, and wherein the controller generates the signal based on the object's proximity to the display. In one embodiment, the input comprises enlargement or reduction of a character, a numeral, a symbol, a graphic, or an icon on the display.

In another embodiment, a mobile terminal includes a case, a display within the case for displaying visual information, a sensing unit within the case for detecting an object in proximity to the display, a haptic module within the case for generating a haptic effect, and a controller within the case for generating a signal corresponding to an input based on the object's location and movement pattern. The sensing unit, which comprises a proximity sensor having a plurality of light emitting devices and a light receiving device, detects the object's location when light emitted by one of the light emitting devices is reflected by the object and enters the light receiving device and also detects the object's movement pattern when lights emitted by adjacent light emitting devices are sequentially reflected by the object and enter the light receiving device.

In one embodiment, a mobile terminal includes a case, a display provided within the case for displaying visual information, a sensing unit provided within the case for detecting an object in proximity to the display, and a controller within the case for generating a signal corresponding to an input based on the object's location and proximity to the display. The sensing unit, which comprises a proximity sensor having a plurality of light emitting devices and a light receiving device, detects the object's location and proximity to the display when light emitted by one of the light emitting devices is reflected by the object and enters the light receiving device.

It is to be understood that both the foregoing general description and the following detailed description of one embodiment are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF EXAMPLE EMBODIMENTS

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of one embodiment. Wherever possible, the same reference numbers will be used throughout the drawings to refer to the same or similar parts.

As used herein, the suffixes 'module', 'unit' and 'part' are used for elements in order to facilitate the disclosure only. Therefore, significant meanings or roles are not given to the suffixes themselves and it is understood that the 'module', 'unit' and 'part' may be used together or interchangeably. One embodiment may be applicable to a various types of terminals. Examples of such terminals include mobile as well as stationary terminals, such as mobile phones, user equipment, smart phones, DTV, computers, digital broadcast terminals, personal digital assistants, portable multimedia players (PMP) and navigators. However, by way of non-limiting example only, further description will be with regard to a mobile terminal 100, but it should be noted that such teachings may apply equally to other types of terminals.

Figure 1:
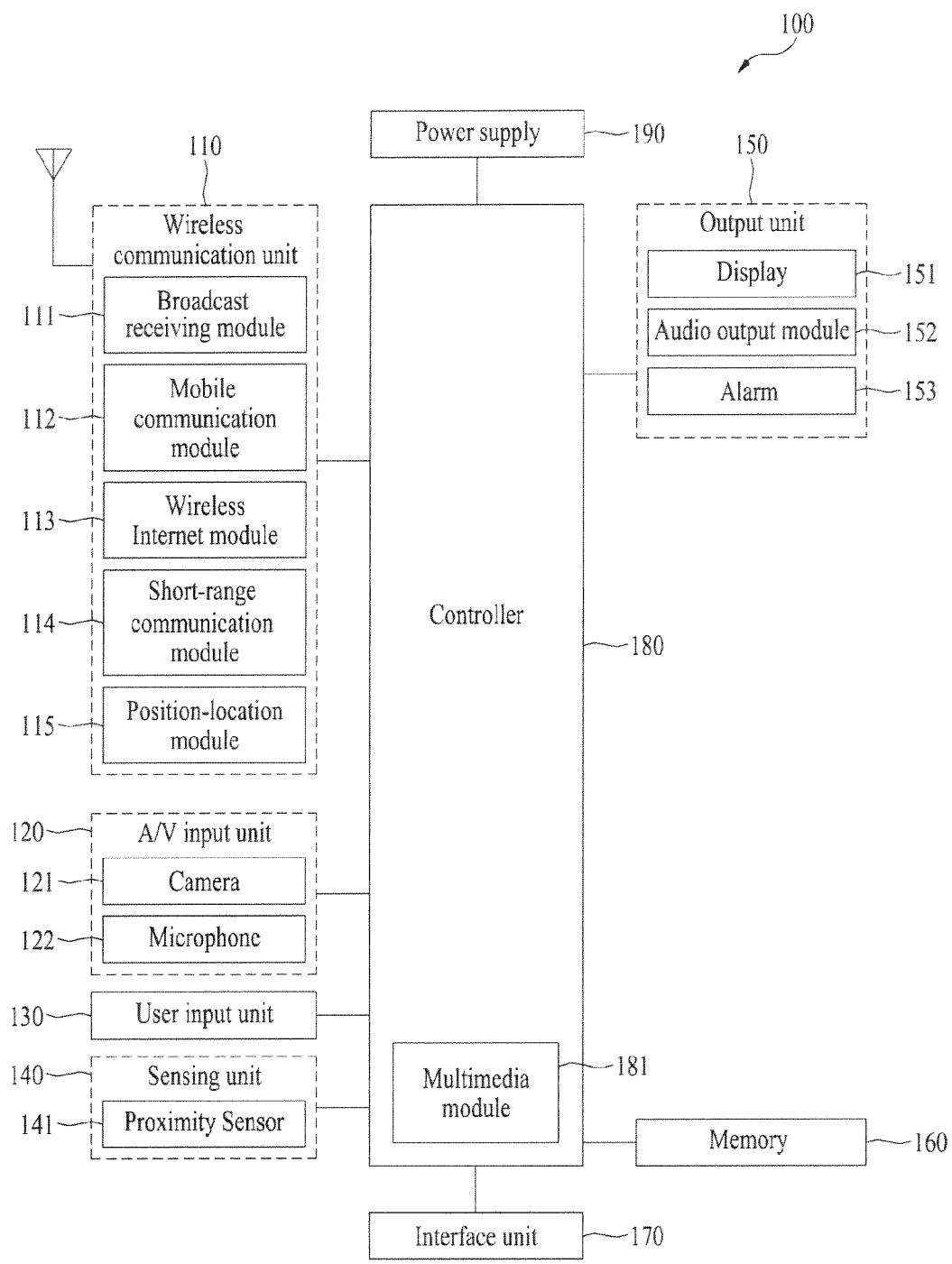
FIG. 1 is a block diagram of a mobile terminal according to one embodiment.

FIG. 1 is a block diagram of a mobile terminal 100 in accordance with an embodiment of one embodiment. FIG. 1 shows the mobile terminal 100 having various components, but it should be understood that implementing all of the illustrated components is not a requirement. Greater or fewer components may alternatively be implemented. FIG. 1 shows a wireless communication unit 110 configured with several commonly implemented components. For example, the wireless communication unit 110 typically includes one or more components which permit wireless communication between the mobile terminal 100 and a wireless communication system or network within which the mobile terminal is located. In case of non-mobile terminals, the wireless communication unit 110 may be replaced with a wire communication unit. The wireless communication unit 110 and wire communication unit may be commonly referred to as a communication unit.

A broadcast receiving module 111 receives a broadcast signal and/or broadcast associated information from an external broadcast managing entity via a broadcast channel. The broadcast channel may include a satellite channel and a terrestrial channel. The broadcast managing entity generally refers to a system which transmits a broadcast signal and/or broadcast associated information. At least two broadcast receiving modules 111 may be provided to the mobile terminal 100 to enable simultaneous reception of at least two broadcast channels or facilitate broadcast channel switching.

Examples of broadcast associated information include information associated with a broadcast channel, a broadcast program, a broadcast service provider, etc. For example, the broadcast associated information may include an electronic program guide (EPG) of digital multimedia broadcasting (DMB) and an electronic service guide (ESG) of digital video broadcast-handheld (DVB-H). The broadcast signal may be implemented, for example, as a TV broadcast signal, a radio broadcast signal, and a data broadcast signal. If desired, the broadcast signal may further include a broadcast signal combined with a TV or radio broadcast signal.

The broadcast receiving module 111 may be configured to receive broadcast signals transmitted from various types of broadcast systems. By non-limiting example, such broadcasting systems include digital multimedia broadcasting-terrestrial (DMB-T), digital multimedia broadcasting-satellite (DMB-S), digital video broadcast-handheld (DVB-H), the data broadcasting system known as media forward link only (MediaFLO®) and integrated services digital broadcast-terrestrial (ISDB-T). Receiving multicast signals is also possible. If desired, data received by the broadcast receiving module 111 may be stored in a suitable device, such as a memory 160.

A mobile communication module 112 communicates wireless signals with one or more network entities such as a base station or Node-B. Such signals may represent, for example, audio, video, multimedia, control signaling, and data. A wireless internet module 113 supports Internet access for the mobile terminal 100. This module may be internally or externally coupled to the mobile terminal 100. Suitable technologies for wireless internet may include, but are not limited to, WLAN (Wireless LAN)(Wi-Fi), Wibro (Wireless broadband), Wimax (World Interoperability for Microwave Access), and HSDPA (High Speed Downlink Packet Access). The wireless internet module may be replaced with a wire internet module in non-mobile terminals. The wireless internet module 113 and wire internet module may be commonly referred to as an internet module.

A short-range communication module 114 facilitates relatively short-range communications. Suitable technologies for short-range communication my include, but are not limited to, radio frequency identification (RFID), infrared data association (IrDA), ultra-wideband (UWB), as well as the networking technologies commonly referred to as Bluetooth and ZigBee. A position-location module 115 identifies or otherwise obtains the location of the mobile terminal 100. This module may be implemented using, for example, global positioning system (GPS) components which cooperate with associated satellites, network components, and combinations thereof.

According to the current technology, the GPS module 115 is able to precisely calculate current 3-dimensional position information based on longitude, latitude and altitude by calculating distance information and precise time information from at least three satellites and then applying triangulation to the calculated information. Currently, location and time information is calculated using three satellites, and errors of the calculated location position and time information are then amended using another satellite. Besides, the GPS module 115 is able to calculate speed information by continuously calculating a real-time current location.

An audio/video (A/V) input unit 120 is configured to provide audio or video signal input to the mobile terminal 100. As shown, the A/V input unit 120 includes a camera 121 and a microphone 122. The camera 121 receives and processes image frames of still pictures or video. A microphone 122 receives an external audio signal while the portable device is in a particular mode, such as phone call mode, recording mode or voice recognition mode. This audio signal is processed and converted into digital data. The portable device, and specifically the A/V input unit 120, typically includes assorted noise removing algorithms to remove noise generated in the course of receiving the external audio signal.

Data generated by the A/V input unit 120 may be stored in the memory 160, utilized by the output unit 150, or transmitted via one or more modules of communication unit 110. If desired, two or more microphones and/or cameras may be used. A user input unit 130 generates input data responsive to user manipulation of an associated input device or devices. Examples of such devices include a keypad, a dome switch, a touchpad such as static pressure/capacitance, a jog wheel and a jog switch. A specific example is one in which the user input unit 130 is configured as a touchpad in cooperation with a display, which will be described in more detail below.

A sensing unit 140 provides status measurements of various aspects of the mobile terminal 100. For example, the sensing unit may detect an open/close status of the mobile terminal 100, relative positioning of components such as a display and keypad of the mobile terminal, a change of position of the mobile terminal or a component of the mobile terminal, a presence or absence of user contact with the mobile terminal, orientation or acceleration/deceleration of the mobile terminal. If the mobile terminal 100 is configured as a slide-type mobile terminal, the sensing unit 140 may sense whether a sliding portion of the mobile terminal is open or closed. Other examples include the sensing unit 140 sensing the presence or absence of power provided by the power supply 190, the presence or absence of a coupling or other connection between the interface unit 170 and an external device.

An interface unit 170 is often implemented to couple the mobile terminal with external devices. Typical external devices include wired/wireless headphones, external chargers, power supplies, storage devices configured to store data such as audio, video, and pictures, as well as earphones and microphones. The interface unit 170 may be configured using a wired/wireless data port, audio input/output ports, video input/output port, a card socket for coupling to a memory card, a subscriber identity module (SIM) card, a user identity module (UIM) card, or removable user identity module (RUIM) card).

When the mobile terminal 110 is connected to an external cradle, the interface unit 170 becomes a passage for supplying the mobile terminal 100 with power from the cradle or a passage for delivering various command signals inputted from the cradle by a user to the mobile terminal 100. Each of the various command signals inputted from the cradle or the power may operate as a signal enabling the mobile terminal 100 to recognize that it is correctly loaded in the cradle.

An output unit 150 generally includes various components that support the output requirements of the mobile terminal 100. A display 151 is typically implemented to visually display information associated with the mobile terminal 100. For example, if the mobile terminal 100 is operating in a phone call mode, the display will generally provide a user interface or graphical user interface that includes information associated with placing, conducting, and terminating a phone call. As another example, if the mobile terminal 100 is in a video call mode or a photographing mode, the display 151 may additionally or alternatively display images associated with these modes.

One implementation includes the display 151 configured as a touch screen working in cooperation with an input device, such as a touchpad. This configuration permits the display 151 to function both as an output device and an input device. The display 151 may be implemented using known display technologies including a liquid crystal display (LCD), a thin film transistor-liquid crystal display (TFT-LCD), an organic light-emitting diode display (OLED), a flexible display and a three-dimensional display. Some of the above displays may be configured transparent so that an external environment may be seen through the corresponding display. Such a display may be called a transparent display. As a representative example for the transparent display, there is a transparent LCD display or the like.

The mobile terminal 100 may include one or more displays 151. An example of a two-display embodiment is one in which one display 151 is configured as an internal display viewable when the terminal is in an opened position and a second display 151 is configured as an external display viewable in both the open and closed positions. The touchscreen may be configured to detect a touch input pressure as well as a touch input position and size. A proximity sensor 141 may be provided within or around the touchscreen. The proximity sensor detects an object approaching a prescribed detecting surface or the presence or absence of an object existing around itself using electromagnetic power or infrared rays without mechanical contact. Hence, the proximity sensor is superior to a contact sensor in lifespan and utilization.

The proximity sensor may operate as follows. First of all, if an object approaches a sensor detecting surface while an oscillation circuit oscillates a sine radio frequency, an oscillation amplitude of the oscillation circuit attenuates or stops. This change is converted to an electric signal to detect the presence or absence of the object. So, even if any material except a metal comes between the RF oscillation proximity sensor and the object, a proximity switch is able to detect the object without interference from the material. In spite of not providing the proximity sensor, if the touchscreen is electrostatic, it may be configured to detect the proximity of a pointer through an electric field change attributed to the proximity of the pointer.

So, if the pointer is placed in the vicinity of the touchscreen without being actually in contact with the touchscreen, it is able to detect the pointer's position and the distance between the pointer and the touchscreen. For clarity and convenience of explanation, an action for enabling the pointer approaching the touchscreen to be recognized as being placed on the touchscreen will be referred to as a 'proximity touch' and an action of enabling the pointer to actually come into contact with the touchscreen will be referred to as a 'contact touch'. The position at which a proximity touch is made to the touchscreen using the pointer refers to the position of the pointer vertically corresponding to the touchscreen when the pointer makes the proximity touch.

If the proximity sensor is used, it is able to sense a proximity touch and its pattern (e.g., proximity touch distance, proximity touch direction, proximity touch speed, proximity touch position, proximity touch moving state, etc.). It is also able to output information corresponding to the sensed proximity touch action and the proximity touch pattern to the touchscreen.

FIG. 1 further shows the output unit 150 having an audio output module 152 which supports the audio output requirements of the mobile terminal 100. The audio output module 152 is often implemented using one or more speakers, buzzers, other audio producing devices, and combinations thereof. The audio output module 152 functions in various modes such as call-receiving mode, call-placing mode, recording mode, voice recognition mode and broadcast reception mode. During operation, the audio output module 152 outputs audio relating to a particular function or status, such as call received, message received, or errors.

The output unit 150 is further shown having an alarm 153, which is commonly used to signal or otherwise identify the occurrence of a particular event associated with the mobile terminal 100. Typical events include call received, message received and user input received. An example of a signal provided by the output unit 150 is tactile sensations. For example, the alarm 153 may be configured to vibrate responsive to the mobile terminal 100 receiving a call or message. As another example, vibration is provided by the alarm 153 responsive to receiving user input at the mobile terminal 100, thereby providing a tactile feedback mechanism. It should be understood that the various signals provided by the components of output unit 150 may be separately performed or performed using any combination of such components.

A memory 160 is generally used to store various types of data to support the processing, control, and storage requirements of the mobile terminal 100. Examples of such data include program instructions for applications operating on the mobile terminal 100, contact data, phonebook data, messages, pictures, and video. Additionally, data for various patterns of vibration and/or sound outputted in case of a touch input to the touchscreen may be stored in the memory 160. As map information may be stored in the memory 160, user convenience may be enhanced by providing the map information to a user if necessary. Additionally, a recent use history or a cumulative use frequency of each menu in the mobile terminal may be stored in the memory 160.

The memory 160 shown in FIG. 1 may be implemented using any type or combination of suitable volatile and non-volatile memory or storage devices including random access memory (RAM), static random access memory (SRAM), electrically erasable programmable read-only memory (EEPROM), erasable programmable read-only memory (EPROM), programmable read-only memory (PROM), read-only memory (ROM), magnetic memory, flash memory, magnetic or optical disk, card-type memory, or other similar memory or data storage device. A controller 180 typically controls the overall operations of the mobile terminal 100. For example, the controller 180 performs the control and processing associated with voice calls, data communications, instant message communication, video calls, camera operations and recording operations.

The controller 180 may include a multimedia module 181 that provides multimedia playback. The multimedia module 181 may be configured as part of the controller 180, or implemented as a separate component. Additionally, the controller 180 is able to perform a pattern recognizing process for recognizing a writing input and a picture drawing input carried out on the touchscreen as characters or images, respectively. A power supply 190 provides power required by the various components for the mobile terminal 100. The power may be internal power, external power, or combinations thereof.

Various embodiments described herein may be implemented in a computer-readable medium using, for example, computer software, hardware, or some combination thereof. For a hardware implementation, the embodiments described herein may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a selective combination thereof. In some cases, such embodiments may also be implemented by controller 180.

For a software implementation, the embodiments described herein may be implemented with separate software modules, such as procedures and functions, each of which perform one or more of the functions and operations described herein. The software codes may be implemented with a software application written in any suitable programming language and may be stored in memory such as the memory 160, and executed by a controller or processor, such as the controller 180.

The mobile terminal 100 may be implemented in a variety of different configurations. Examples of such configurations include folder-type, slide-type, bar-type, rotational-type, swing-type and combinations thereof. For clarity, further disclosure will primarily relate to a slide-type mobile terminal 100. However such teachings apply equally to other types of mobile terminals.

Figure 2:
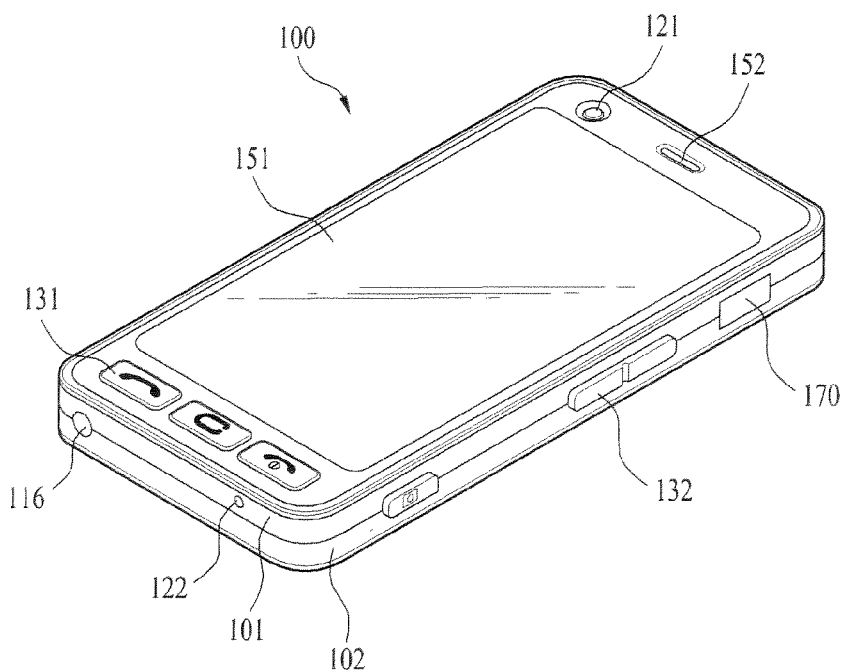
FIG. 2 is a front perspective view of a mobile terminal according to one embodiment.

FIG. 2 is a front perspective diagram of a mobile terminal according to one embodiment. The mobile terminal 100 shown in the drawing has a terminal body of a bar type. Yet, the mobile terminal 100 may be implemented in a variety of different configurations. Examples of such configurations include folder-type, slide-type, rotational-type, swing-type and combinations thereof. For clarity, further disclosure will primarily relate to a bar-type mobile terminal 100. However, such teachings apply equally to other types of mobile terminals.

Referring to FIG. 2, the mobile terminal 100 includes a case (casing, housing, cover, etc.) configuring an exterior thereof. In the present embodiment, the case may be divided into a front case 101 and a rear case 102. Various electric/electronic parts are loaded in a space provided between the front and rear cases 101 and 102. Optionally, at least one middle case may be further provided between the front and rear cases 101 and 102 in addition. The cases 101 and 102 are formed by injection molding of synthetic resin or may be formed of metal substance such as stainless steel (STS), titanium (Ti) or the like for example.

A display 151, an audio output unit 152, a camera 121, user input units 130/131 and 132, a microphone 122, an interface 180 and the like may be provided to the terminal body, and more particularly, to the front case 101. The display 151 occupies most of a main face of the front case 101. The audio output unit 151 and the camera 121 are provided to an area adjacent to one end of the display 151, while the user input unit 131 and the microphone 122 are provided to another area adjacent to the other end portion of the display 151. The user input unit 132 and the interface 170 may be provided to lateral sides of the front and rear cases 101 and 102.

The input unit 130 is manipulated to receive a command for controlling an operation of the terminal 100. Also, the input unit 130 is able to include a plurality of manipulating units 131 and 132. The manipulating units 131 and 132 may be named a manipulating portion and may adopt any mechanism of a tactile manner that enables a user to perform a manipulation action by experiencing a tactile feeling.

Content inputted by the first or second manipulating unit 131 or 132 may be diversely set. For instance, a command such as start, end, scroll and the like is inputted to the first manipulating unit 131. Also, a command for a volume adjustment of sound outputted from the audio output unit 152, a command for a switching to a touch recognizing mode of the display 151 or the like may be inputted to the second manipulating unit 132.

Figure 3:
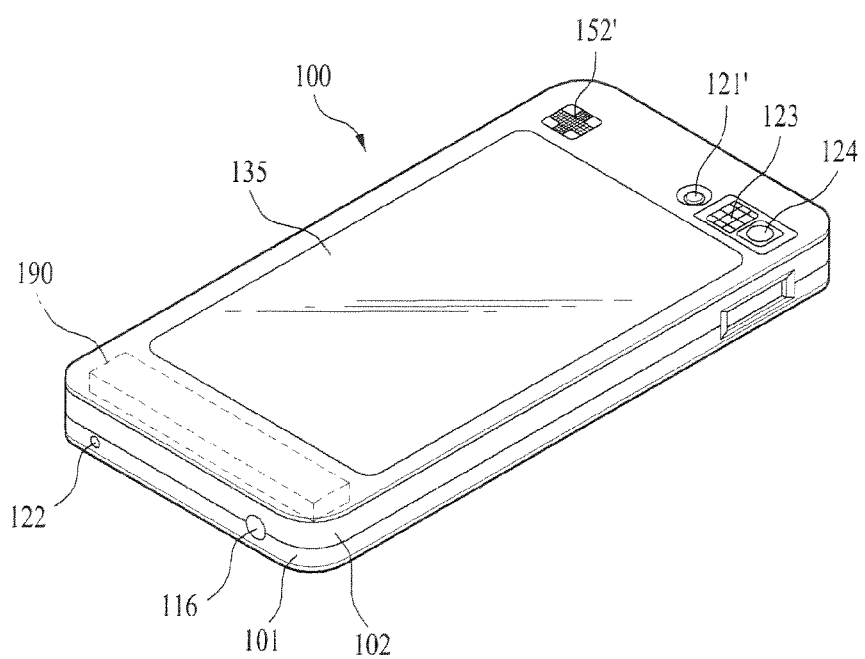
FIG. 3 is a rear perspective view of a mobile terminal according to one embodiment.

FIG. 3 is a perspective diagram of a backside of the terminal shown in FIG. 2. Referring to FIG. 3, a camera 121' may be additionally provided to a backside of the terminal body and, more particularly, to the rear case 102. The camera 121 has a photographing direction that is substantially opposite to that of the former camera 121 shown in FIG. 2 and may have pixels differing from those of the former camera 121.

In one embodiment, for instance, the former camera 121 has low pixels enough to capture and transmit a picture of user's face for a video call, while the latter camera 121' has high pixels for capturing a general subject for photography without transmitting the captured subject. Each of the cameras 121 and 121' may be installed at the terminal body to be rotated or popped up. A flash 123 and a mirror 124 are additionally provided adjacent to the camera 121'. The flash 123 projects light toward a subject in case of photographing the subject using the camera 121'. If a user attempts to take a picture of the user (self-photography) using the camera 121', the mirror 124 enables the user to view the user's face as reflected by the mirror 124.

An additional audio output unit 152' may be provided to the backside of the terminal body. The additional audio output unit 152' is able to implement a stereo function together with the former audio output unit 152 shown in FIG. 2 and may be used for implementation of a speakerphone mode in talking over the terminal. A broadcast signal receiving antenna 124 may be additionally provided to the lateral side of the terminal body as well as an antenna for communication or the like. The antenna 124 constructing a portion of the broadcast receiving module 111 shown in FIG. 1 may be retractably provided to the terminal body.

A power supply unit 190 for supplying a power to the terminal 100 is provided to the terminal body. Also, the power supply unit 190 may be configured to be built within the terminal body. Alternatively, the power supply unit 190 may be configured to be detachably connected to the terminal body. A touchpad 135 for detecting a touch may be additionally provided to the rear case 102. The touchpad 135 may be configured in a light transitive type like the display 151. In this case, if the display 151 is configured to output visual information from its both faces, it is able to recognize the visual information via the touchpad 135 as well. The information outputted from both of the faces may be entirely controlled by the touchpad 135. Alternatively, a display is further provided to the touchpad 135 so that a touchscreen may be provided to the rear case 102 as well.

The touchpad 135 is activated by interconnecting with the display 151 of the front case 101. The touchpad 135 may be provided in rear of the display 151 in parallel. The touchpad 135 may have a size equal to or smaller than that of the display 151. The proximity sensor 141 described with reference to FIG. 1 is explained in detail with reference to FIG. 4 as follows.

Figure 4:
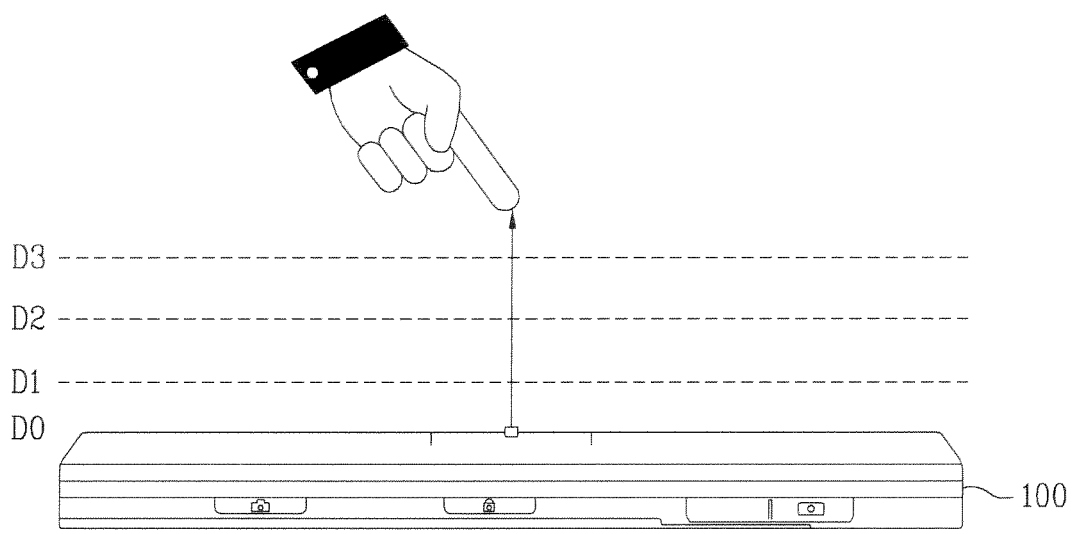
FIG. 4 is a diagram to explain the concept of proximity depth of a proximity sensor according to one embodiment.

FIG. 4 is a conceptual diagram for explaining a proximity depth of a proximity sensor. Referring to FIG. 4, when a pointer such as a user's finger, a pen and the like approaches the touchscreen, a proximity sensor 141 provided within or in the vicinity of the touchscreen detects the approach of the pointer and then outputs a proximity signal. The proximity sensor 141 may be configured to output a different proximity signal according to the distance between the pointer and the proximity-touched touchscreen (hereinafter referred to as the 'proximity depth).

In FIG. 4, exemplarily shown is a cross-section of the touchscreen provided with a proximity sensor capable of outputting signals associated with three proximity depths for example. However, it should be understood that a proximity sensor capable of outputting signals associated with proximity depths less than 3 or greater or equal to 4 is possible in other embodiments. In detail, if the pointer is in full contact with the touchscreen (d0), it is recognized as a contact touch. If the pointer is located less than d1 distance from the touchscreen, it is recognized as a proximity touch to a first proximity depth. If the pointer is located between d1 and d2 distances from the touchscreen, it is recognized as a proximity touch to a second proximity depth. If the pointer is located less than d3 distance or equal to or greater than d2 distance from the touchscreen, it is recognized as a proximity touch to a third proximity depth. If the pointer is located equal to or greater than d3 distance from the touchscreen, it is recognized as a proximity touch that is released.

Figure 5:
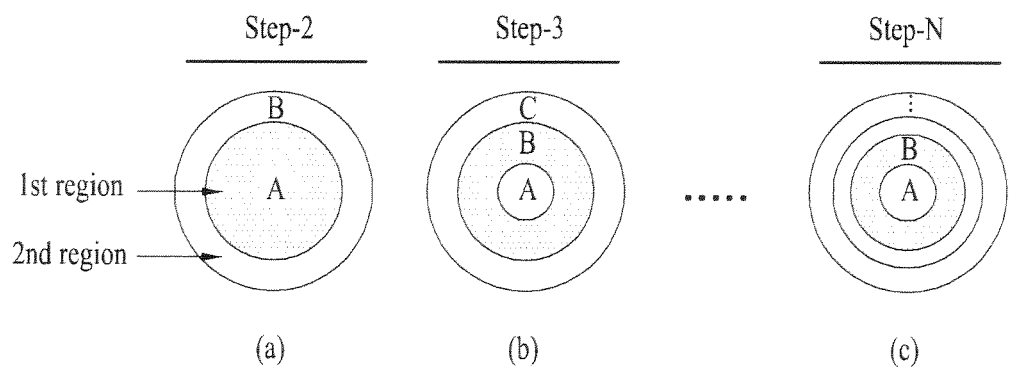
FIG. 5 and FIG. 6 are diagrams to explain the concepts of a proximity touch recognizing area for detecting a proximity signal and a haptic area for generating a tactile effect, respectively according to one embodiment.
Figure 6:
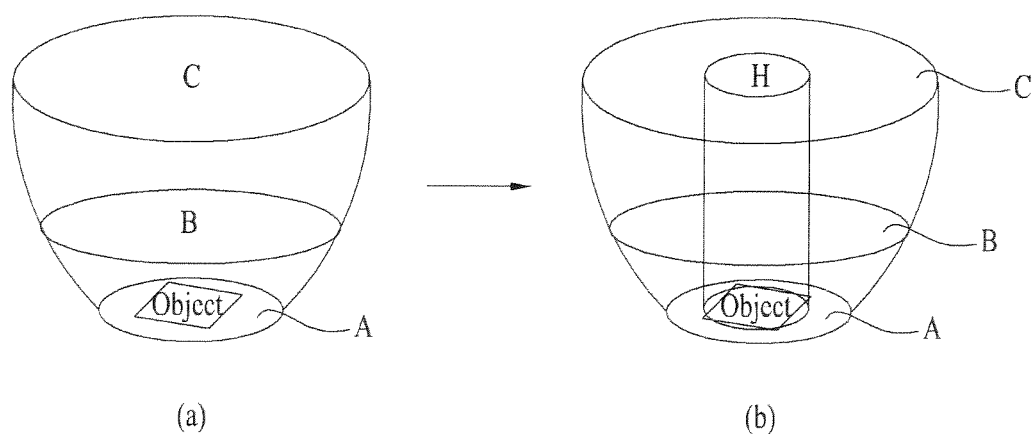

Hence, the controller 180 is able to recognize the proximity touch as one of various input signals according to the proximity depth and position of the pointer. And, the controller 180 is able to perform various operation controls according to the various input signals. FIG. 5 and FIG. 6 are diagrams for the description of a proximity touch recognition area and a tactile effect generation region. FIG. 5 represents an object such as an icon, a menu item and the like in a circle type for clarity and convenience of explanation.

A region for displaying an object on the display 151, as shown in (a) of FIG. 5, may be divided into a first region A at a central part and a second region B enclosing the first region A. The first and second regions A and B may be configured to generate tactile effects differing from each other in strength or pattern. For instance, the first and second regions may be configured to generate 2-step vibrations by outputting a first vibration if the second region B is touched or outputting a second vibration greater than the first vibration if the first region A is touched.

If both the proximity touch recognition region and the haptic region are simultaneously set in the region having the object displayed therein, the haptic region for generating the tactile effect is set to be different from the proximity touch recognition region for detecting the proximity signal. In particular, the haptic region is set to be narrower or wider than the proximity touch recognition region. For instance, in (a) of FIG. 5, the proximity touch recognition region is set to the area including both of the first and second regions A and B. And, the haptic region is set to the first region A.

The region having the object displayed therein may be divided into three regions A, B and C as shown in (b) of FIG. 5. Alternatively, the region having the object displayed therein may be divided into N regions (N>4) as shown in (c) of FIG. 5. And, each of the divided regions may be configured to generate a tactile effect having a different strength or pattern. If a region having a single object represented therein is divided into at least three regions, the haptic region and the proximity touch recognition region may be set to differ from each other according to a use environment.

The size of the proximity touch recognition region of the display 151 may be configured to vary according to a proximity depth. In particular, referring to (a) of FIG. 6, the proximity touch recognition region is configured to decrease by C→B→A according to the proximity depth for the display 151. On the contrary, the proximity touch recognition region is configured to increase by C→B→A according to the proximity depth for the display 151. Despite the above configuration, the haptic region may be set to have a predetermined size, as the region 'H' shown in (b) of FIG. 6, regardless of the proximity depth for the display 151.

If the object-displayed region for the setting of the haptic region or the proximity touch recognition region is divided, one of various schemes of horizontal/vertical division, radial division and combinations thereof may be used as well as the concentric circle type division shown in FIG. 5.

A mobile terminal 100 according to one embodiment includes a pair of cases 101 and 102 configuring an exterior of the mobile terminal 100, a display 151 provided within the cases 101 and 102 to display visual information, a proximity sensor 141 provided within the cases 101 and 102 to have a plurality of light emitting devices and a light receiving device provided between the light emitting devices adjacent to each other, a sensing unit 140 detecting a proximity location of an object and a motion of the object, and a controller 180 generating an input signal corresponding to a specific key input or a direction shift based on the proximity location of the object and a pattern of the motion of the object and then delivering the input signal to the display 151.

In this case, the specific key input may include inputs of a plurality of numeral keys, character keys, direction (navigation) keys, scroll keys and/or function keys. Various kinds of visual information may be displayed on the display 151. This information may be displayed as characters, numerals, symbols, graphics, icons and/or the like. In order to input the information, at least one of the characters, numerals, symbols, graphics and icons are represented as a predetermined array to be implemented in a keypad formation. This keypad formation may be so-called 'soft keys'. Additionally, the specific key input may include an input of the soft key.

The display 151 operates as one whole area or may operate by being divided into a plurality of zones. In the latter case, a plurality of the zones may be configured to inter-operate with each other. As mentioned in the foregoing description, the direction key performs a function of inter-shift of a plurality of graphics or icons displayed on the display 151. The direction keys may include a 2-direction key working in width or length direction and/or a 4-direction key working in four directions including top, bottom, right and left directions in a circle.

The function keys may include a menu key, a delete key, a camera drive key and/or the like. The mobile terminal 100 according to one embodiment facilitates a contactless input of an inter-icon shift of a menu through a direction selection displayed visually on the display 151, a display screen switching, a display screen scroll shift and the like using a proximity sensor.

Figure 7:
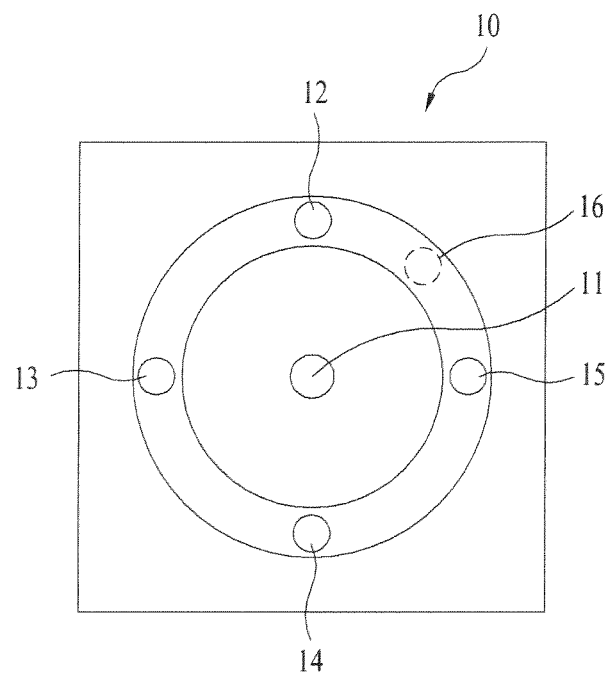
FIG. 7 is a conceptual diagram of a first example for a proximity sensor of a mobile terminal according to one embodiment.
Figure 8:
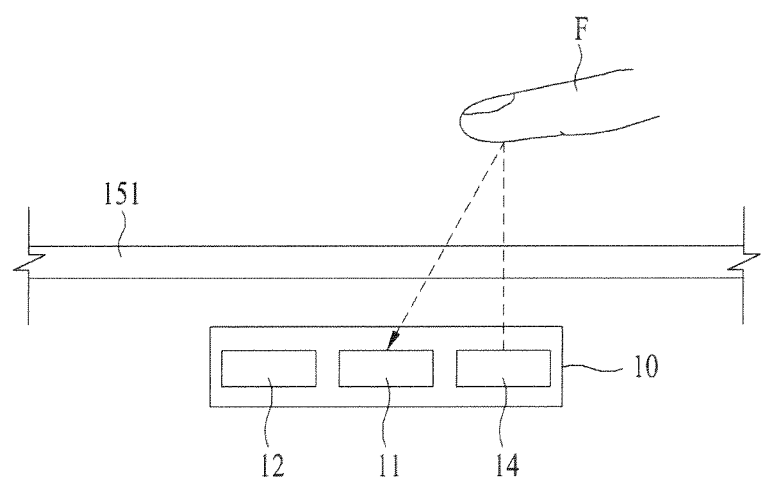
FIG. 8 is a conceptual diagram illustrating operation of the proximity sensor shown in FIG. 7 according to one embodiment.

FIG. 7 is a conceptual diagram of a first example for a proximity sensor constructing a mobile terminal according to one embodiment, and FIG. 8 is a conceptual diagram illustrating operation of the proximity sensor shown in FIG. 7. Referring to FIG. 7, a proximity sensor 10 includes a light receiving device 11 provided to its center and a plurality of light emitting devices 12 to 15 arranged in a circle centering on the light receiving device 11.

In this case, for example, 2 to 8 light emitting devices may be provided. FIG. 7 shows 4 light emitting devices 12, 14, 13 and 15 in top, bottom, left and right directions, respectively, in accordance with one exemplary embodiment. The proximity sensor 10 may further include a compensation light emitting device 16 configured to apply light to the light receiving device 11 at the center. The light emitting device and the light receiving device may include an infrared emitting device and an infrared receiving device, respectively.

Referring to FIG. 8, if light applied by the light emitting device 14 is reflected by a proximate object F (e.g., a finger) and then enters the light receiving device 11, the sensing unit (not shown in the drawing) detects a proximity location of the object. If lights applied by the adjacent light emitting devices 12 and 14 are sequentially reflected and then enter the light receiving device 11, the sensing unit is able to detect motion the object's motion.

Additionally, the proximity sensor 10 may be provided to a bottom side or a peripheral area of the display 151. FIG. 6 shows that the proximity sensor 10 is provided to the bottom side of the display, in accordance with one exemplary embodiment. The controller enables a plurality of the light emitting devices to sequentially emit light clockwise or counterclockwise. This sequential light emission enables the motion pattern of the object to be detected.

Referring to FIG. 7, if an object approaches an initial proximity location according to a proximity extent of the object, a prescribed light emitting device corresponding to the proximity location of the object emits light. Subsequently, the rest of the light emitting devices emit light sequentially clockwise or counterclockwise by starting with the prescribed light emitting device. For instance, assuming that the light emitting devices arranged at top, bottom, left and right sides are named first to fourth light emitting devices 12, 14, 13 and 15 with reference to a front side of the drawing shown in FIG. 7, respectively, if an object approaches the first light emitting device 12, the first light emitting device 12 starts to emit light according to a preset proximity depth. The light (e.g., infrared ray) emitted from the first light emitting device 12 is reflected by an object F and then enters the light receiving device 11. In this case, the sensing unit (not shown in the drawing) detects a proximity location of the object according to the presence or absence of the light incident to the light receiving device 11.

Afterwards, if the object moves toward the second light emitting device 14 and the first to fourth light emitting devices sequentially emit light, the light emitted from the second light emitting device is reflected by the object F and then enters the light receiving device 11. In this case, the sensing unit detects a motion pattern (for clarity's sake, referred to as a vertical direction) of the object moving from the first light emitting device 12 to the second light emitting device 14 according to the presence or absence of the reflected light applied by the first light emitting device 12.

Likewise, the sensing unit is able to detect a motion pattern (for clarity's sake, referred to as a horizontal direction) of the object moving from the third light emitting device 13 to the fourth light emitting device 15. Therefore, as mentioned in the foregoing description, if the first to fourth light emitting devices 12, 14, 13 and 15 are made to emit light sequentially, the horizontal or vertical motion pattern of the object may be detected. According to the detected motion pattern, the controller generates and delivers various input signals to the display 151, thereby providing diverse display effects and input environments.

Figure 9:
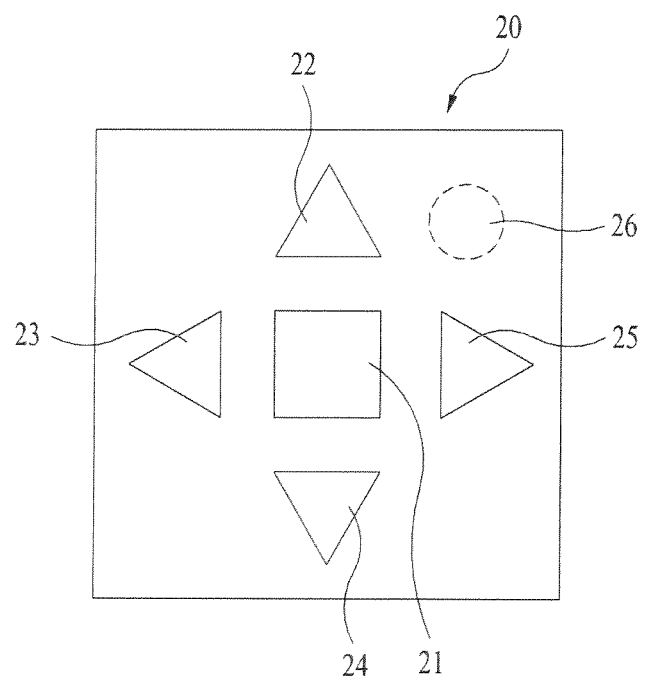
FIG. 9 is a conceptual diagram of a second example for a proximity sensor of a mobile terminal according to one embodiment.

FIG. 9 is a conceptual diagram of a second example for a proximity sensor 20 of a mobile terminal according to one embodiment. Referring to FIG. 9, a proximity sensor 20 includes a light receiving device 21 provided to its center and a plurality of light emitting devices 22 to 25 arranged in a circle centering on the light receiving device 21. In this case, for example, 2 to 8 light emitting devices may be provided. FIG. 7 shows 4 light receiving devices 22, 24, 23 and 25 in top, bottom, left and right directions, respectively, in accordance with one exemplary embodiment.

The proximity sensor 20 may further include a compensation light emitting device 26 configured to apply light to the light receiving device 21 at the center. The light emitting device and the light receiving device may include an infrared emitting device and an infrared receiving device, respectively. Operation of the proximity sensor 20 shown in FIG. 9 is similar to that of the former proximity sensor 10 described with reference to FIG. 7. With regard to a visual aspect provided to a user, FIG. 9 shows the proximity sensor of a direction key type display, whereas FIG. 7 shows the proximity sensor of a wheel type display. However, one embodiment is not limited to display types such as the wheel type, the direction key type and the like.

Figure 10:
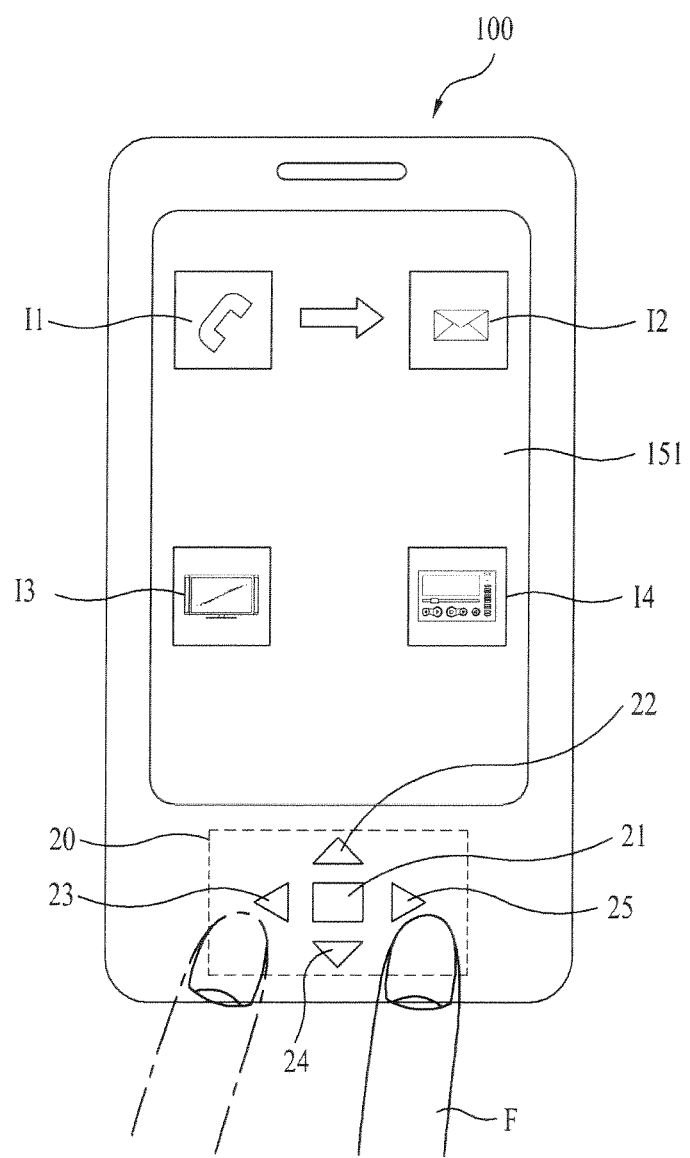
FIG. 10 and FIG. 11 are front diagrams of a mobile terminal according to one embodiment to explain one operational state of the mobile terminal.
Figure 11:
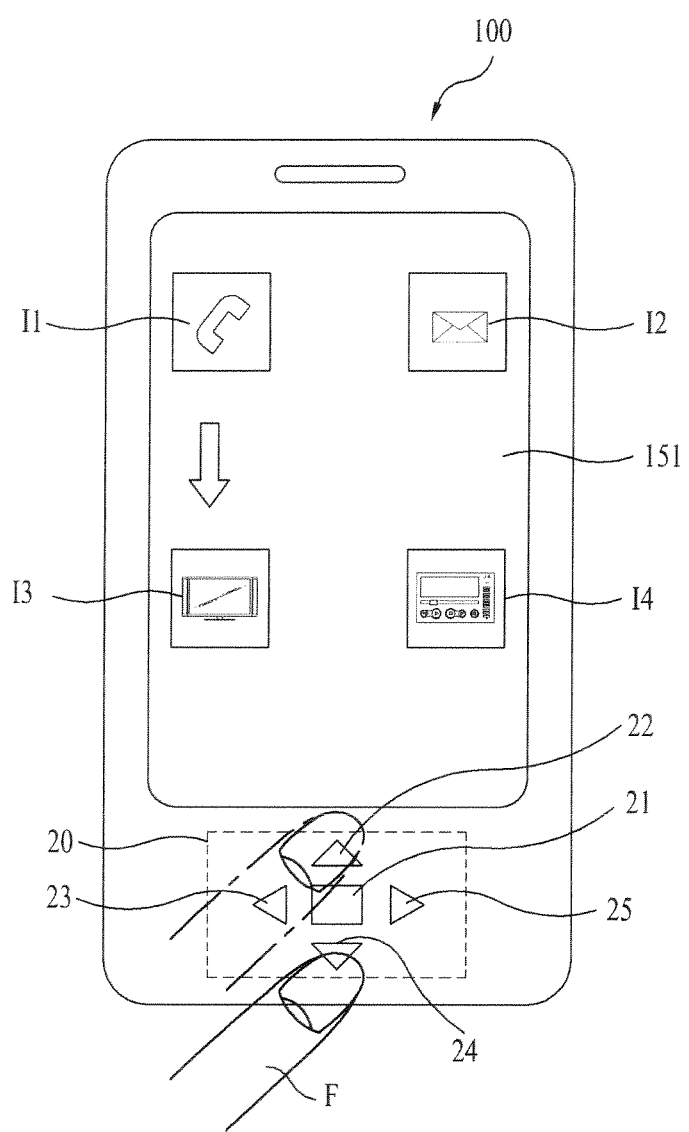

FIG. 10 and FIG. 11 are front diagrams of a mobile terminal according to one embodiment to explain one operational state of the mobile terminal. As mentioned in the foregoing description, since the operation of the proximity sensor 20 shown in FIG. 9 is similar to that of the former proximity sensor 10 described with reference to FIG. 7, the following description is made with reference to the proximity sensor 20 shown in FIG. 9 but also applies to the former proximity sensor shown in FIG. 7.

Referring to FIG. 10 and FIG. 11, a plurality of icons I1 to I4, e.g., various kinds of menu items are uniformly arranged on the display 151 of the mobile terminal 100. Further, a proximity sensor 20 may be provided to a lower part of the display 151 with reference to the front side of FIG. 10 or FIG. 11, for example. When an object approaches an initial proximity location according to a proximity extent of the object, a prescribed light emitting device corresponding to the proximity location of the object emits light. Subsequently, the rest of the light emitting devices start to emit light sequentially clockwise or counterclockwise by starting with the former light emitting device.

The light emitting devices provided to top, bottom, left and right sides with reference to the front side of FIG. 10 or FIG. 11 shall be referred to as first to fourth light emitting devices 22, 24, 23 and 25, respectively. When an object F approaches the third light emitting device 23, the third light emitting device 23 starts to emit light according to a preset proximity depth. The light (e.g., infrared ray) emitted from the third light emitting device 23 is reflected by the object F and then enters the light receiving device 21.

In this case, the sensing unit (not shown in the drawing) detects a proximity location of the object according to the presence or absence of the light incident to the light receiving device 21. In particular, the sensing unit detects that the object is located at a corresponding zone of the third light emitting device 23. Afterwards, when the object moves toward the fourth light emitting device 24 and the first to fourth light emitting devices sequentially emit light, the light emitted from the fourth light emitting device 24 is reflected by the object F and then enters the light receiving device 21.

In this case, the sensing unit detects a motion pattern (for clarity, referred to as a horizontal direction) of the object moving from the third light emitting device 23 to the fourth light emitting device 25 according to the presence or absence of the reflected light applied by the fourth light emitting device 24. Likewise, the sensing unit is able to detect a motion pattern (for clarity, referred to as a vertical direction) of the object moving from the first light emitting device 22 to the second light emitting device 24.

In one embodiment, an output corresponding to the motion pattern in the horizontal direction such as a screen switching, a horizontal icon shift and the like is stored in the controller (not shown in the drawing) in advance. And, an output corresponding to the motion pattern in the vertical direction such as a screen scroll shift, a vertical icon shift and the like is stored in the controller (not shown in the drawing) in advance.

In this case, if the sensing unit (not shown in the drawing) including the proximity sensor 20 detects the horizontal motion pattern, the controller delivers the corresponding output to the display. An operation such as screen switching, a horizontal icon shift (e.g., I1→I2, cf. FIG. 10) and the like may be then performed by the display 151. Likewise, if the sensing unit (not shown in the drawing) detects the vertical motion pattern, the controller delivers the corresponding output to the display. An operation such as a screen scroll shift, a vertical icon shift (e.g., I1→I3, cf. FIG. 10) and the like may be then performed by the display 151.

So far, in the above description, the sensing unit detects the motion pattern and then causes an input effect corresponding to the detected motion pattern, in accordance with one exemplary embodiment. Alternatively, the light emitting devices indicating directions may include a navigation (direction) key as well. As mentioned in the foregoing description, a user enables a finger to approach the light emitting devices 22, 24, 23 and 25 corresponding to the top, bottom, left and right directions, respectively, whereby a cursor or pointer located at an identity (e.g., the icon I1, I2, I3 or I4) displayed on the display 151 may be shifted.

If the finger approaches the proximity sensor, the corresponding finger moving path may be visually displayed on the display 151. Thus, an input signal corresponding to a specific key input or a direction shift may be generated, which, in turn, generates a specific action, using the wheel type (cf. FIG. 7) or the button type (cf. FIG. 9) via the proximity sensor 10/20 described with reference to FIGS. 7 to 9. Also, diverse display effects may be provided by delivering the input signal to the display 151.

Also, the sensing unit detects a proximity depth of an object as well as a direction shift, generates an input signal corresponding to a specific key input based on a pattern according to the proximity sensor, and is then able to deliver the input signal to the display 151. In this case, the specific key includes a zoom-in or zoom-out key of a character, numeral, symbol, graphic or icon displayed on the display or may include a power on/off key.

For instance, with regard to the proximity sensor 10/20, if an object such as a finger and the like approaches a specific icon zone of the display 151 within a predetermined distance, the controller is able to display an output signal for enlarging a size of a corresponding icon to the display. If the object gets remote from the specific icon zone by a predetermined distance, the controller is able to display an output signal for reducing a size of a corresponding icon to the display. Likewise, in case that the proximity sensor 10/20 works as a function key such as a power key, a power on/off function of the mobile terminal may be performed according to a proximity depth.

Figure 12:
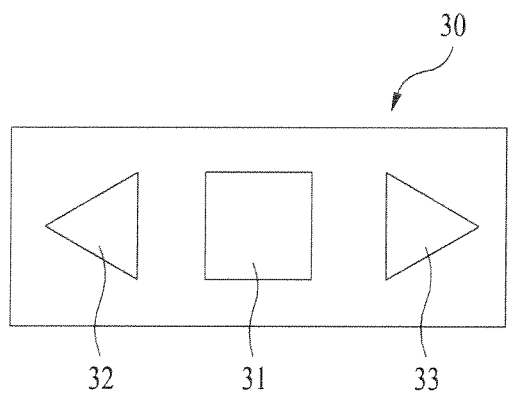
FIG. 12 is a conceptual diagram of a third example for a proximity sensor constructing a mobile terminal according to one embodiment.

FIG. 12 is a conceptual diagram of a third example for a proximity sensor of a mobile terminal according to one embodiment. Referring to FIG. 12, a proximity sensor 30 includes a light receiving device 31 provided to its center and a pair of light emitting devices 32 and 33 provided in horizontal or vertical direction centering on the light receiving device 31. Operation of the proximity sensor 30 is almost identical to that of the former proximity sensor 10/20 described with reference to FIGS. 7 and 9. The configuration shown in FIG. 12, however, differs in that either a horizontal motion or a vertical motion may be detected.

Figure 13:
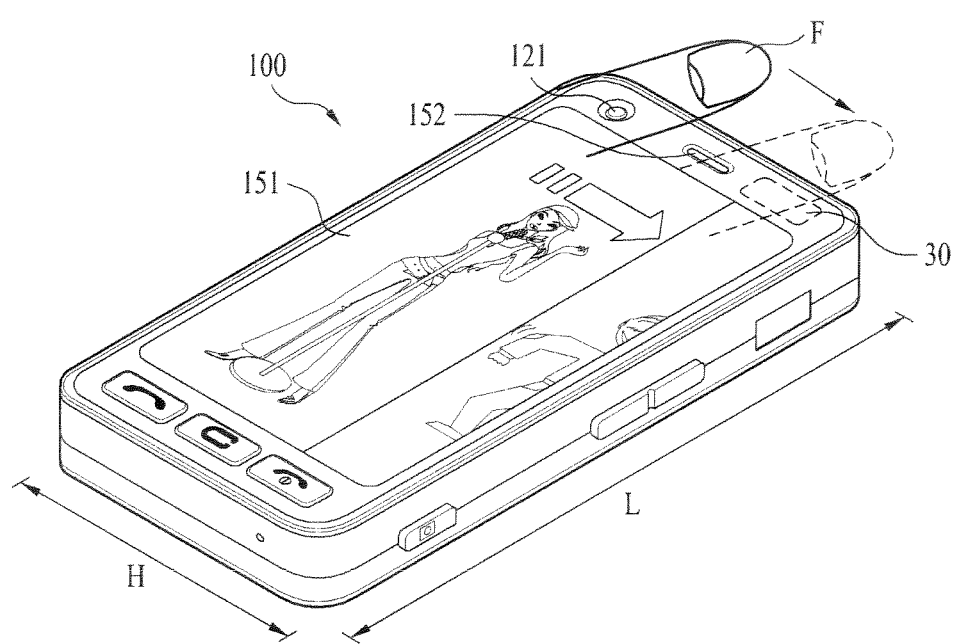
FIGS. 13 to 15 are front diagrams of a mobile terminal according to one embodiment to explain one operational state of the mobile terminal.

FIG. 13 is a front diagram of a mobile terminal according to one embodiment to explain one operational state of the mobile terminal. When a user views various documents, photos or the like via the display 151 of the mobile terminal 100, FIG. 13 shows an operational process for a screen switching to a next page or a next photo. A proximity sensor 30 may be provided to a bottom side or a peripheral area of the display 151. FIG. 13 shows that the proximity sensor 30 is provided to the peripheral area of the display 151.

Figure 14:
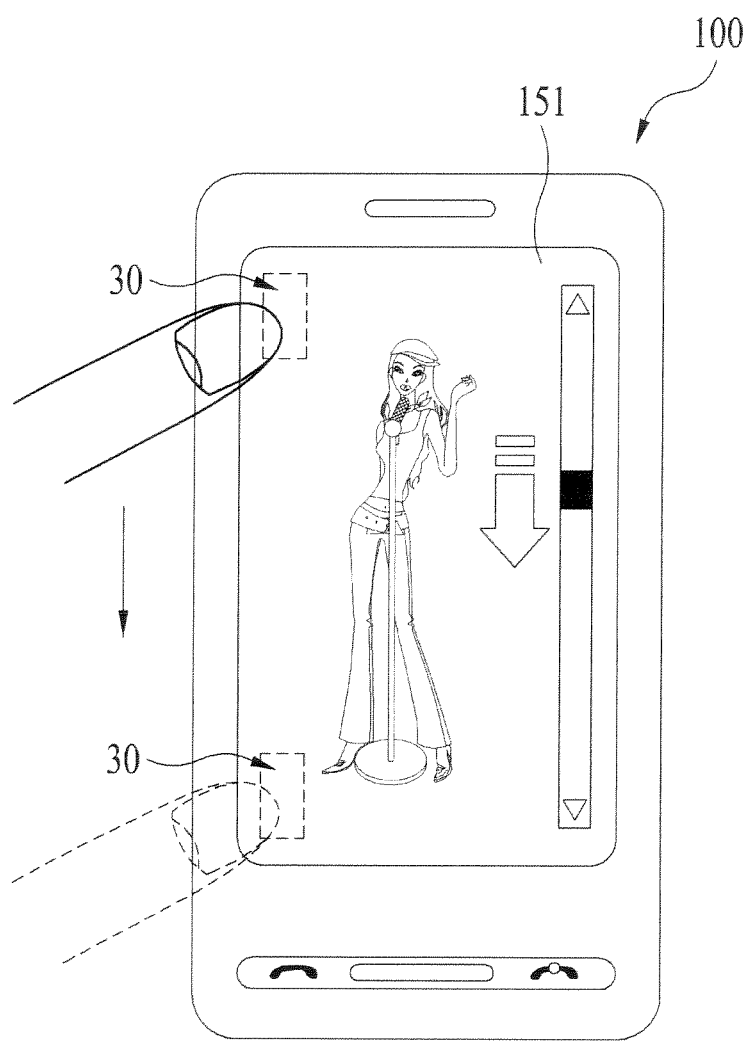

Referring to FIG. 13, the screen switching of the display 151 may be performed by a user inputting a horizontal motion to the proximity sensor 30 using a finger F or the like. FIG. 14 is a front diagram of a mobile terminal according to one embodiment to explain one operational state of the mobile terminal.

Referring to FIG. 14, the sensing unit (not shown in the drawing) includes a plurality of proximity sensors 30. In particular, a plurality of the proximity sensors 30 are spaced apart from each other in either a horizontal direction ('L1' shown in FIG. 13) or a vertical direction ('L2' shown in FIG. 14) of the display 151. A horizontal or vertical motion of an object may be detected by a pair of proximity sensors adjacent to each other. Also, a scroll input system is shown in FIG. 14.

A mobile terminal according to another embodiment of one embodiment includes a case configuring an exterior of the mobile terminal 100, a display provided within the case to display visual information, a proximity sensor provided within the case to have a plurality of light emitting devices and a light receiving device provided between the light emitting devices adjacent to each other, and a sensing unit detecting a proximity location of an object and the object's motion.

Additionally, the mobile terminal includes a haptic module providing a user with a haptic effect and a controller generating an input signal corresponding to a specific key input or a direction shift based on the proximity location of the object and a pattern of the motion of the object and then delivering the input signal to the display.

The mobile terminal includes the haptic module in addition to the former mobile terminal 100. The controller delivers the input signal to the display and the haptic module, providing a haptic effect as well as a visual effect. The above-configured mobile terminal 100 according to one embodiment detects an input signal corresponding to a direction shift based on a motion pattern of a direction key or a proximity object using a single proximity sensor and then delivers an output signal corresponding to the detected input signal to the display and/or the haptic module. Therefore, the mobile terminal implements diverse display effects and diverse haptic effects and also provides a wide-ranging user input environment.

Figure 15:
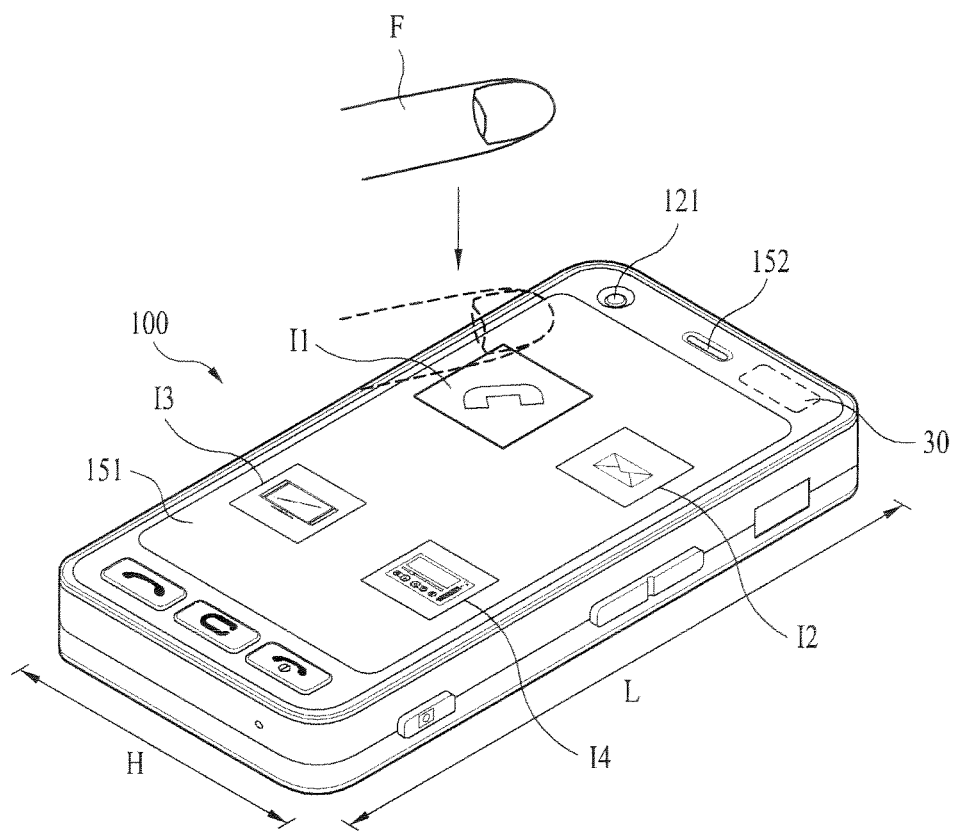

FIG. 15 is a perspective diagram of a mobile terminal according to one embodiment to explain one operational state of the mobile terminal. According to the present embodiment, the sensing unit includes a proximity sensor provided within the case to have a plurality of light emitting devices and a light receiving device arranged between the adjacent light emitting devices. If light applied by a prescribed light emitting device is reflected by an approaching object and then enters the light receiving device, the sensing unit detects a proximity location and a proximity depth of the object.

The controller generates an input signal corresponding to a specific key input or enlargement and/or reduction of the specific key based on the proximity location and depth of the object and then controls the display according to a control signal corresponding to the input signal. As mentioned in the foregoing description, the specific key input may include inputs of a plurality of numeral keys, character keys, direction (navigation) keys, scroll keys and/or function keys. The proximity sensor may include a plurality of light emitting devices arranged in a circumferential direction centering on a light receiving device at its center. Also, the controller enables a plurality of the light emitting devices to emit light sequentially clockwise or counterclockwise.

Referring to FIG. 15, the controller is able to adjust the enlargement/reduction ratio of an icon I1 for generating the specific key, and more particularly, a specific input signal according to the proximity depth detected by the proximity sensor. In particular, the sensing unit detects light reflected by one of the light emitting devices arranged in a vertical or horizontal direction. And, the controller is able to convert a previously selected specific key input to a specific key input of a detected light emitting device side centering on the light receiving device.

According to one embodiment, the above-described methods may be implemented in a program recorded medium as computer-readable code. The computer-readable media include all kinds of recording devices in which data readable by a computer system are stored. The computer-readable media include ROM, RAM, CD-ROM, magnetic tapes, floppy discs, optical data storage devices, and the like, for example, and also carrier-wave type implementations (e.g., transmission via Internet).

It will be apparent to those skilled in the art that various modifications and variations may be made in one embodiment without departing from the spirit or scope of the inventions. Thus, it is intended that one embodiment covers the modifications and variations of this invention provided they come within the scope of the appended claims and their equivalents.

What is claimed is:

1. A mobile terminal comprising:
   a case;
   a display within the case for displaying visual information;
   a sensing unit comprising a proximity sensor for detecting an object in proximity of the display, the proximity sensor having a light receiving device and a plurality of light emitting devices arranged in a circular pattern around the light receiving device; and
   a controller configured to:
      control the plurality of light emitting devices to emit light such that each of the plurality of light emitting devices emits light in a sequential order in a clockwise or counterclockwise direction, one light emitting device emitting the light at a time;
      control the sensing unit to detect the object's location and movement when at least first light emitted by a first one of the plurality of light emitting devices and second light emitted by a second one of the plurality of light emitting devices are sequentially reflected by the object and the reflected light is received by the light receiving device; and generate a signal corresponding to an input based on the detected location and movement of the object.

2. The mobile terminal of claim 1, wherein the input comprises at least a numeral key, a character key, a direction key, a direction shift, a scroll key, or a function key.

3. The mobile terminal of claim 1, wherein a number of the plurality of light emitting devices ranges from 2 to 8.

4. The mobile terminal of claim 1, wherein the proximity sensor further comprises a compensation light emitting device configured to emit light toward the light receiving device.

5. The mobile terminal of claim 1, wherein the sensing unit comprises a plurality of proximity sensors, wherein the proximity sensors are arranged horizontally or vertically on the display, and wherein horizontal or vertical movement of the object is detected by at least two proximity sensors that are adjacent to each other.

6. The mobile terminal of claim 1, wherein the proximity sensor is located at a lower end or a peripheral area of the display.

7. The mobile terminal of claim 1, wherein the controller is further configured to generate the signal based on the object's proximity to the display by detecting the object's proximity to the display.

8. The mobile terminal of claim 7, wherein the input comprises enlargement or reduction of a character, a numeral, a symbol, a graphic, or an icon on the display.

9. A mobile terminal comprising:
a case;
a display within the case for displaying visual information;
a sensing unit comprising a proximity sensor for detecting an object in proximity of the display, the proximity sensor having a light receiving device and a plurality of light emitting devices arranged in a circular pattern around the light receiving device;
a haptic module within the case for generating a haptic effect; and
a controller within the case configured to:
control the plurality of light emitting devices to emit light sequentially in a clockwise or counterclockwise direction, one light emitting device emitting the light at a time;
control the sensing unit to detect the object's location and movement when the light emitted by at least two of the plurality of light emitting devices is sequentially reflected by the object and the reflected light is received by the light receiving device; and
generate a signal corresponding to an input based on the detected location and movement of the object.

10. The mobile terminal of claim 9, wherein number of the light emitting devices ranges from 2 to 8.

11. A mobile terminal comprising:
a case;
a display within the case for displaying visual information;
a sensing unit for detecting an object in proximity to the display,
wherein the sensing unit comprises a light receiving device and a plurality of light emitting devices arranged in a circular pattern around the light receiving device,
wherein the sensing unit detects the object's location and proximity to the display when light emitted by at least one of the light emitting devices is reflected by the object and the reflected light is received by the light receiving device; and
a controller configured to:
control the plurality of light emitting devices to emit light sequentially in a clockwise or counterclockwise direction, one light emitting device emitting the light at a time;
control the sensing unit to detect the object's location and proximity to the display when the light emitted by at least two of the plurality of light emitting devices is sequentially reflected by the object and the reflected light is received by the light receiving device;
generate a signal corresponding to an input based on the detected location and proximity of the object;
control the sensing unit to detect the object's location and movement when the light emitted by at least two of the plurality of light emitting devices is sequentially reflected by the object and the reflected light is received by the light receiving device; and
generate a signal corresponding to an input based on the detected location and movement of the object,
wherein user input is provided to the mobile terminal by way of moving the object in one or more directions in proximity of the sensing unit.

12. The mobile terminal of claim 11, wherein the input comprises at least a numeral key, a character key, a direction key, a direction shift, a scroll key, or a function key.

13. The mobile terminal of claim 11, wherein the controller is further configured to convert a previously selected input to the input associated with the light emitting device from which the reflected light was emitted.

14. The mobile terminal of claim 11, wherein the controller is further configured to adjust an enlargement or reduction ratio of the input according to the object's proximity to the display.

* * * * *